United States Patent
Wu et al.

(10) Patent No.: US 12,292,470 B2
(45) Date of Patent: May 6, 2025

(54) DEFECT DETECTION SYSTEM FOR CAVITY IN INTEGRATED CIRCUIT

(71) Applicant: GlobalFoundries U.S. Inc., Malta, NY (US)

(72) Inventors: Zhuojie Wu, Port Chester, NY (US); Yunyao Jiang, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 137 days.

(21) Appl. No.: 18/172,488

(22) Filed: Feb. 22, 2023

(65) Prior Publication Data
US 2024/0280632 A1    Aug. 22, 2024

(51) Int. Cl.
G01R 31/28 (2006.01)
G02B 6/12 (2006.01)

(52) U.S. Cl.
CPC ..... *G01R 31/2884* (2013.01); *G02B 6/12004* (2013.01)

(58) Field of Classification Search
CPC ............ G01R 31/2884; G02B 6/12004
See application file for complete search history.

(56) References Cited

U.S. PATENT DOCUMENTS

| | | | |
|---|---|---|---|
| 5,345,205 A * | 9/1994 | Kornrumpf | H01L 24/18 29/829 |
| 5,807,763 A * | 9/1998 | Motika | G01R 31/312 438/18 |
| 7,676,121 B2 | 3/2010 | Gill et al. | |
| 8,890,560 B2 | 11/2014 | Kaltalioglu | |
| 9,947,602 B2 | 4/2018 | Wu et al. | |
| 10,770,407 B2 | 9/2020 | Wu et al. | |
| 11,105,846 B1 * | 8/2021 | Polomoff | G01R 31/2884 |
| 2002/0030507 A1 * | 3/2002 | Farnworth | G01R 31/2884 361/101 |
| 2021/0173145 A1 * | 6/2021 | Fasano | G02B 6/1225 |
| 2021/0356514 A1 | 11/2021 | Polomoff et al. | |

FOREIGN PATENT DOCUMENTS

CN    112652668 A *    4/2021    ............. G02B 6/122

* cited by examiner

*Primary Examiner* — Lee E Rodak
*Assistant Examiner* — Demetrius R Pretlow
(74) *Attorney, Agent, or Firm* — Jessie Cheah; Hoffman Warnick LLC (57) ABSTRACT

A structure provides a defect sensor for a cavity in an integrated circuit (IC). The structure includes a cavity defined in a substrate. A boundary is located where the cavity meets with a cavity-free area of the substrate. A metal line is arranged in a serpentine path in both a vertical and a horizontal direction and crosses the boundary. A controller may be provided that is configured to, in response to a change in an electrical characteristic of a signal through the metal line, generate an indication of the presence of a defect and/or change operation of at least one component of the IC. The structure may find application relative to a photonics integrated circuit (PIC) structure including an optical waveguide with a cavity under the optical waveguide.

18 Claims, 10 Drawing Sheets

DEFECT DETECTION SYSTEM FOR CAVITY IN INTEGRATED CIRCUIT

BACKGROUND

The present disclosure relates to integrated circuit structures and, more particularly, to a defect detection system for a cavity in an integrated circuit.

Defect detection in integrated circuits (ICs) allows corrective actions to be implemented to avoid stoppage in operation of components of the IC. Certain ICs include cavities therein over which other components are positioned. One example of this structure includes a photonic IC (PIC) including a cavity under an optical waveguide and a heater for the optical waveguide. A cavity in the IC, and especially those with components thereover, introduces new integrity risks for which current defect sensors are insufficient.

SUMMARY

All aspects, examples and features mentioned below can be combined in any technically possible way.

An aspect of the disclosure provides a defect detection system for an integrated circuit, comprising: a metal line arranged in a serpentine path in both a vertical and a horizontal direction and crossing a boundary of a cavity and a cavity-free area of the substrate; and a controller configured to, in response to a change in an electrical characteristic of a signal through the metal line, generate an indication of a presence of a defect.

An aspect of the disclosure provides a photonics integrated circuit (PIC), comprising: an optical waveguide over a substrate, the optical waveguide in optical communication with at least one opto-electrical component; a cavity in the substrate under the optical waveguide, a boundary located where the cavity meets a cavity-free area of the substrate; and a defect detection system including: a metal line arranged in a serpentine path in both a vertical and a horizontal direction and crossing the boundary, and a controller configured to, in response to a change in an electrical characteristic of a signal through the metal line, generate an indication of a defect.

An aspect of the disclosure provides a method of detecting a defect in an integrated circuit (IC), comprising: transmitting an electrical signal through a metal line arranged in a serpentine path in both a vertical and a horizontal direction and crossing a boundary of a cavity and a cavity-free area of a substrate, the cavity defined in the substrate; and in response to a change in an electrical characteristic of the signal through the metal line, changing operation of at least one component of the IC.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a defect detection system for a cavity in an integrated circuit (IC). The system includes a cavity defined in a substrate, and a boundary is located where the cavity meets a cavity-free area of the substrate, i.e., the boundary is of the cavity and the cavity-free area of the substrate. A metal line is arranged in a serpentine path in both a vertical and a horizontal direction and crosses the boundary. A controller may be provided that is configured to, in response to a change in an electrical characteristic of a signal through the metal line, generate an indication of (presence of) a defect and/or change operation of at least one component of the IC. The structure may find application relative to a photonic integrated circuit (PIC) including an optical waveguide with a cavity under the optical waveguide. The system allows early detection of a defect, such as a crack, before the defect stops operation of components in the IC. Despite the exact location of the boundary of the cavity being difficult to control during fabrication (e.g., because of under or over etching during formation of the cavity), the serpentine metal line always crosses the boundary. Hence, defect detection can be ensured (as will be described) and a larger fabrication tolerance for the cavity is permissible.

Figure 1:
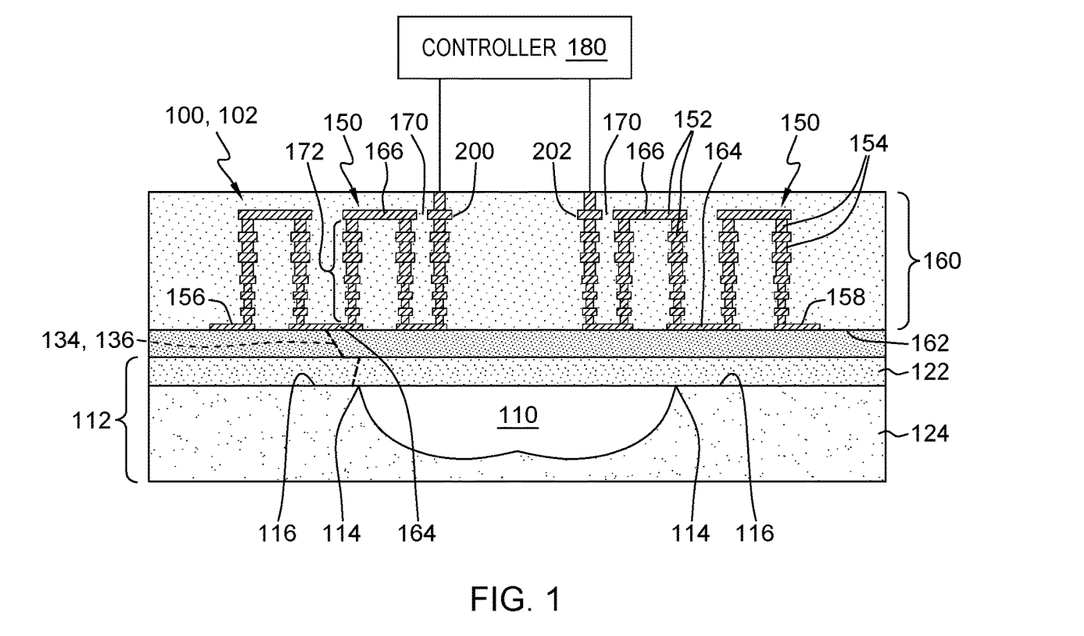
FIG. 1 shows a cross-sectional view of a defect detection system for an integrated circuit, according to embodiments of the disclosure.
Figure 2:
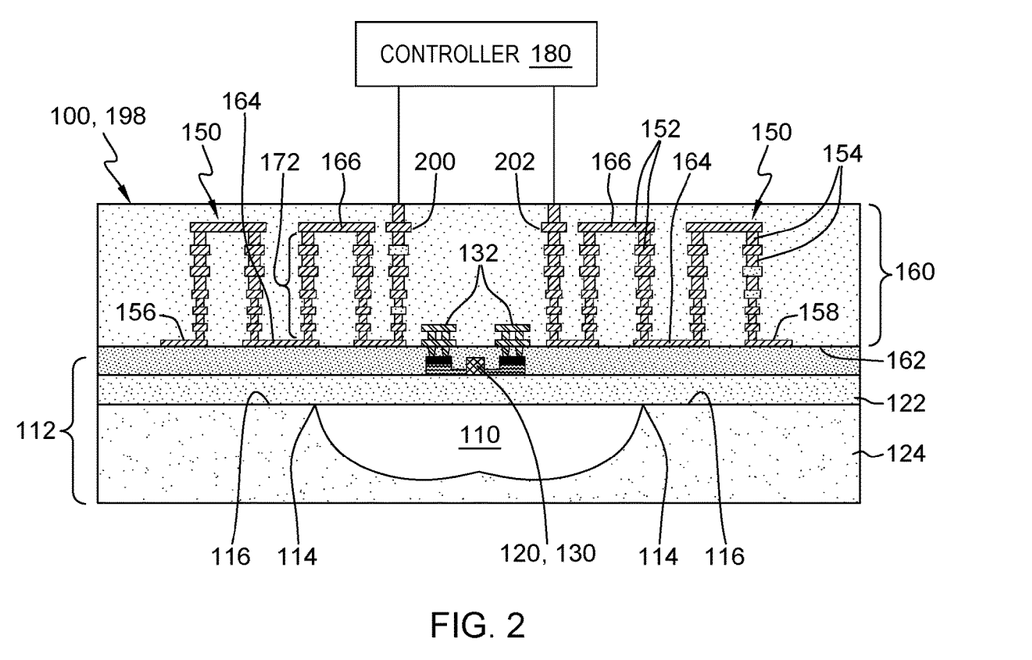
FIG. 2 shows a cross-sectional view of a defect detection system for a photonic integrated circuit, according to other embodiments of the disclosure.

FIGS. 1 and 2 show cross-sectional views of a defect detection system 100 according to embodiments of the disclosure. System 100 detects defect(s) relative to a cavity 110 defined in a substrate 112 of an integrated circuit (IC) 102 (FIG. 1), such as but not limited to a photonic integrated circuit PIC 198 (FIGS. 2, 6-11). Cavity 110 is defined in substrate 112, and includes a boundary 114 with a cavity-free area 116 of substrate 112. Substrate 112 may include any now known or later developed semiconductor substrate in which cavity 110 may be employed. In FIGS. 1 and 2, substrate 112 is illustrated as a semiconductor-on-insulator (SOI) substrate. Embodiments of IC 102 (FIG. 1) or PIC 198 (FIG. 2) include a semiconductor substrate 112. For purposes of description, semiconductor substrate 112 is illustrated and described as a semiconductor-on-insulator (SOI) substrate. Semiconductor substrate 112, when implemented as an SOI substrate includes a layered semiconductor-insulator-semiconductor substrate in place of a more conventional silicon substrate (bulk substrate). In this case, semiconductor substrate 112 may include a semiconductor-on-insulator (SOI) layer 120 (not shown in FIG. 1) over a buried insulator layer 122 over a base semiconductor layer 124. SOI layer 120 and base semiconductor layer 124 may include but are not limited to: silicon, germanium, silicon germanium, silicon carbide, or any other common semiconductor material. Buried insulator layer 122 may include any appropriate dielectric such as but not limited to silicon dioxide, i.e., forming a buried oxide (BOX) layer. The precise thickness of buried insulating layer 122 and SOI layer 120 may vary widely with the intended application. Other substrates such as bulk semiconductor substrates are also possible.

In the example shown in FIGS. 1 and 2, devices formed in SOI layer 120 that otherwise form IC 102 or PIC 198 have been omitted for clarity. In the FIG. 2 example, a (silicon) optical waveguide 130 is formed in SOI layer 120 over cavity 110, i.e., over buried insulator layer 122 over cavity 110. While shown in SOI layer 120, optical waveguide 130 may be alternatively formed in layers over SOI layer 120, e.g., in a silicon nitride layer. Optical waveguide 130 may be formed using any known technology.

Cavity 110, which may also be referred to as an undercut, may be formed in base semiconductor layer 124 using any now known or later developed technique, e.g., forming openings through SOI layer 120 and buried insulator layer 122 and performing an appropriate etching to remove base semiconductor layer 124, e.g., via a reactive ion etching. The openings (not shown) may be filled with a dielectric, e.g., the same material as buried insulator layer 122, to seal cavity 110. In any event, boundary 114 is where cavity 110 meets with non-cavity area 116 that is not etched away. While shown as having a particular shape such as a rectangle, it will be recognized that cavity 110 and boundary 114 thereof can have a variety of regular and irregular shapes, all of which are considered within the scope of the disclosure. Non-cavity area 116 may be any part of a surrounding material such as base semiconductor layer 124 and/or buried insulator layer 122 that creates an edge of cavity 110. FIG. 1 shows an embodiment in which cavity 110 may be provided for electrical insulation purposes, e.g., as air gap dielectric in base semiconductor layer 124. Cavity 110 in FIG. 1 may have other devices, e.g., transistor, resistors, capacitors, passive elements, etc., thereover that are not shown. In contrast, FIG. 2 shows an embodiment in which a particular component, i.e., a (silicon) optical waveguide 130 perhaps with a heater 132, is provided over cavity 110. In this case, cavity 110 provides thermal as well as electrical insulation. Heater 132 can take any form. While cavity 110 in FIG. 2 includes optical waveguide 130 thereover, it will be recognized by those with skill in the art that cavity 110 may have other devices, e.g., transistor, resistors, capacitors, passive elements, opto-electric devices, etc., thereover that are not shown.

It has been discovered that near boundary 114 presents an increased area of stress and hence a higher risk of forming defects 134 that may affect the operation of components of the IC. FIG. 1 shows an example defect 134 in the form of a crack 136 that emanates from boundary 114. Defects 134 may take a variety of alternative forms such as but not limited to cracks, delamination, voids, or combinations thereof. Early detection of defects 134 is desired so that corrective action can be taken in the IC before components fail.

Figure 3:
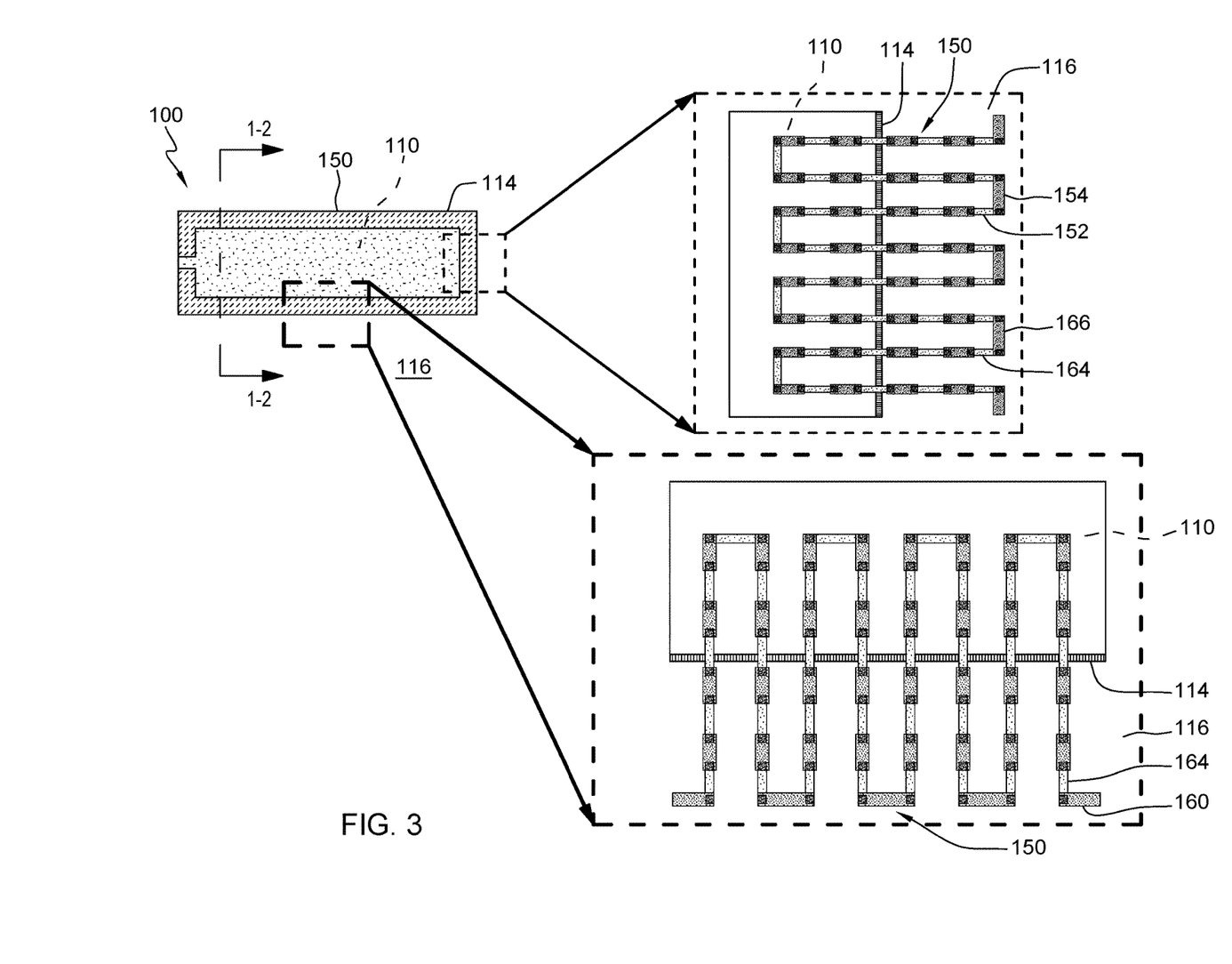
FIG. 3 shows a schematic top-down view with two enlarged portions of a metal line of the system, according to embodiments of the disclosure.
Figure 4:
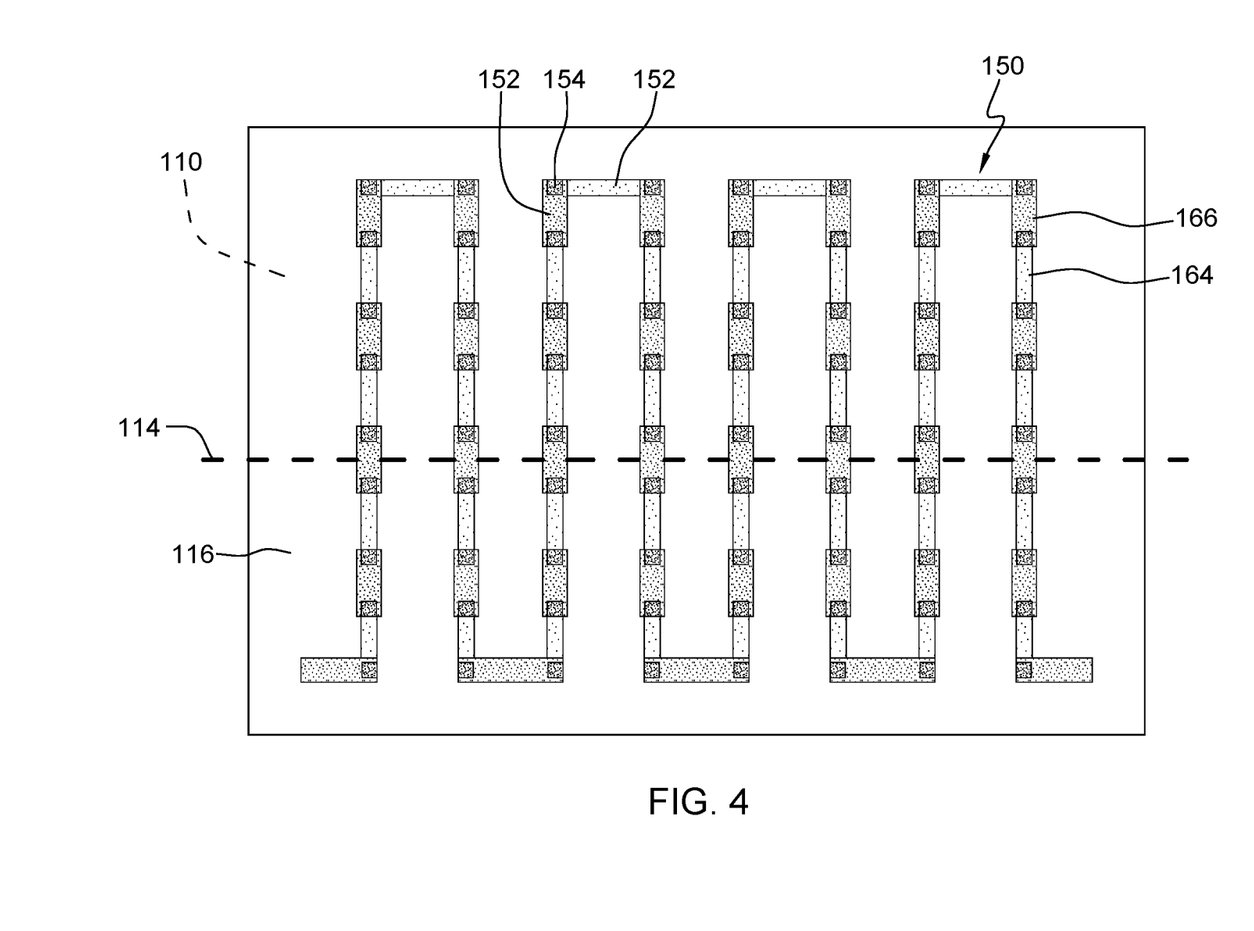
FIG. 4 shows an enlarged, schematic top-down view of a metal line of the system, according to embodiments of the disclosure.

Embodiments of the disclosure provide early detection of defects 134 by providing a metal line 150 arranged in a serpentine path in both a vertical and a horizontal direction and crossing boundary 114. Metal line 150 crossing boundary 114 ensures any defect 134 generated by the stress at boundary 114 is detected early so corrective actions can be taken. FIGS. 1 and 2 show metal line 150 extending in a serpentine path in a vertical direction, i.e., with peaks and valleys of metal wires 152 and vias 154 extending in a vertical manner in system 100. FIG. 3 shows a schematic top-down view with enlarged portions of system 100 showing metal line 150 at different locations about cavity 110, and FIG. 4 shows an enlarged schematic top-down view of metal line 150. (FIG. 3 also shows cross-sectional view line 1-2 for FIGS. 1 and 2 but without optical waveguide 130 (FIG. 2) for clarity.) FIGS. 3 and 4 show metal line 150 extending in a serpentine path in a horizontal direction, i.e., with peaks and valleys of metal wires 152 in different layers (connected by vertical metal wires 152 and vias 154) extending in a horizontal manner in system 100. It is noted that in FIGS. 1 and 2, where metal line 150 is shown ending on the far left side and far right side with metal wires 156, 158, metal line 150 continues extending into or out of the page of the drawings as shown in FIGS. 3 and 4. Similarly, in FIGS. 3 and 4, metal line 150 extends into and out of the page of the drawing.

While the sinusoidal paths are shown in FIGS. 1-4 as uniform, i.e., with equal peak amplitude and frequency, some variation is possible. For example, some variation caused by fabrication tolerances is possible. In another example, metal line 150 may cross boundary 114 in a range of +/−1000 nanometers to +/−100,000 nanometers. Further, as shown in the enlarged schematic top-down view of FIG. 5A, metal line 150 may be formed with any amplitude and/or frequency and the amplitude and/or frequency may vary along its length in a horizontal direction. Similarly, as shown in the cross-sectional view of FIG. 5B, metal line 150 may be formed with any amplitude and/or frequency and the amplitude and/or frequency may vary along its length in a vertical direction. Different frequencies and/or amplitude of metal line 150 may be desired in certain circumstances. For example, other structure (e.g., higher concentration of transistors or other devices (not shown)) may further increase the stress near boundary 114 in certain locations. In this case, the frequency and/or amplitude of the serpentine path (vertically and/or horizontally) may be higher in a region 176 (FIG. 4A) where defect 134 (FIG. 1) may be considered more likely, and less frequent in a region 178 where the defects may be less likely, to allow for early detection.

Figure 5A:
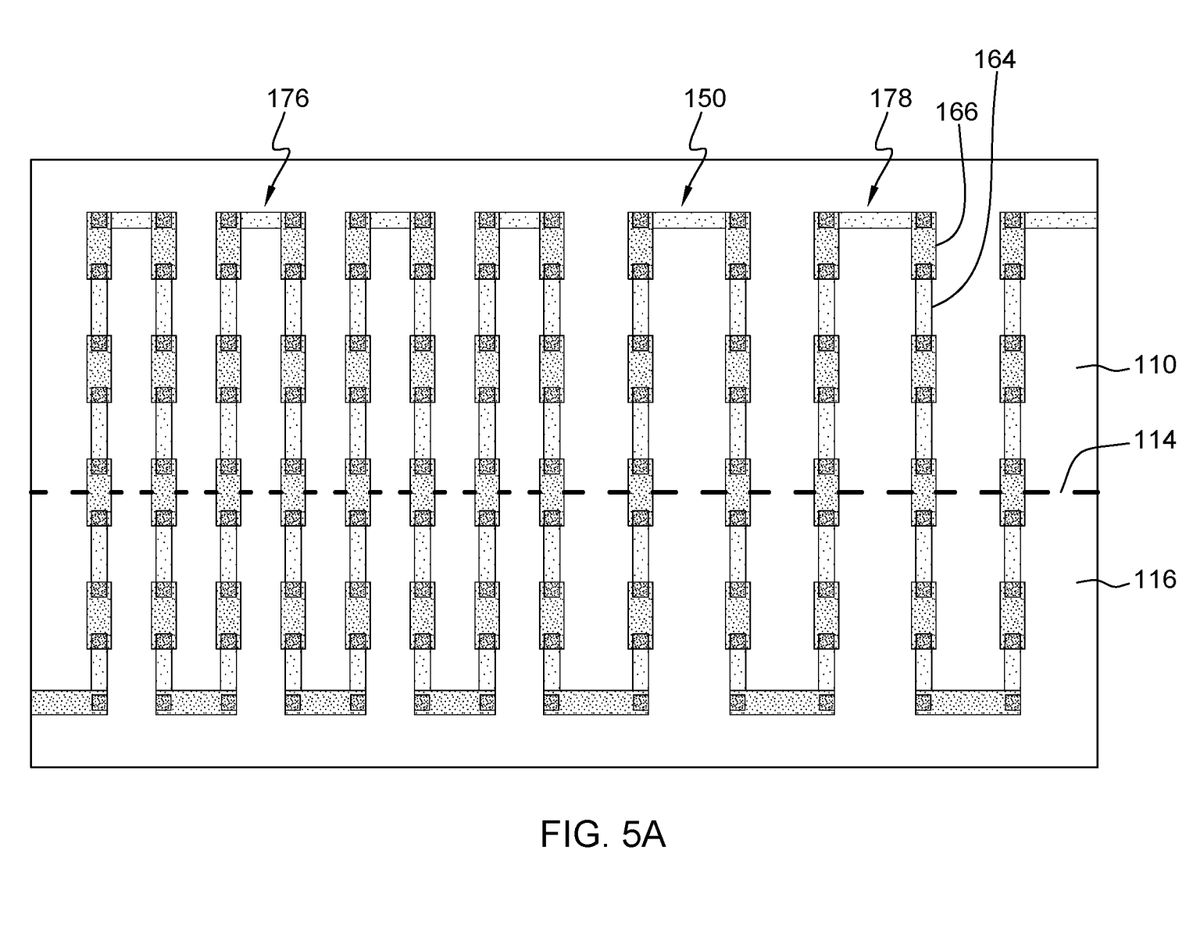
FIGS. 5A-B show enlarged, schematic top-down views of a metal line of the system, according to other embodiments of the disclosure.
Figure 5B:
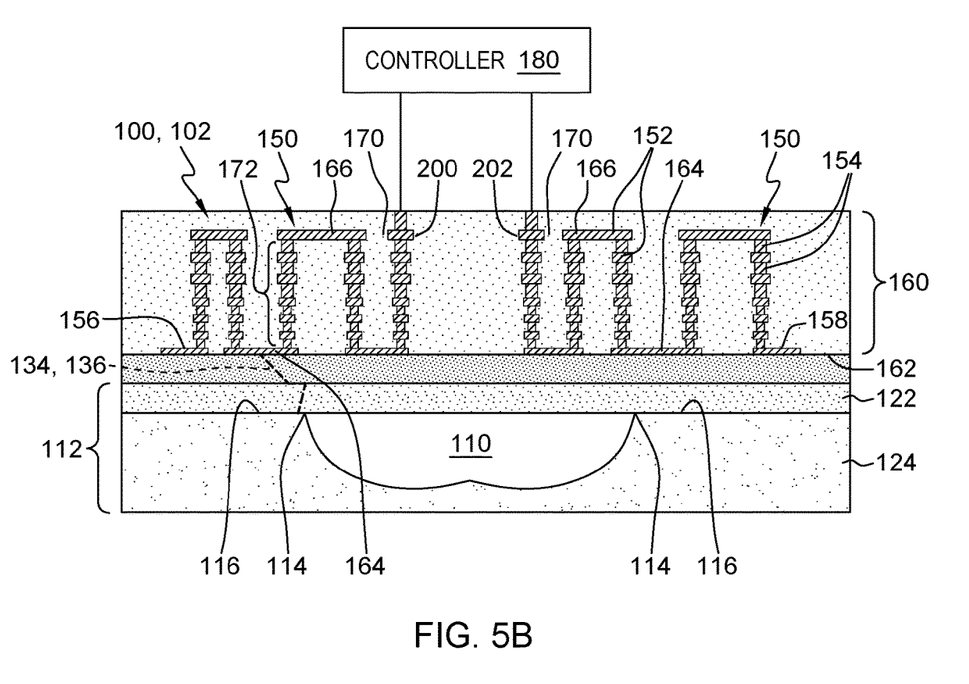

Metal wires 152 and/or vias 154 of metal line 150 may be formed using any now known or later developed techniques, e.g., damascene or dual damascene processes. In vertical portions 172 of metal line 150, the line may include any number of metal wires 152 (164, 166) running horizontally and vias 154 running vertically to provide the desired height. Metal line 150 may include any appropriate conductive metals such as but not limited to copper, aluminum and/or tungsten. Although not shown for clarity, metal line 150 may also include any appropriate refractory metal liner (e.g., ruthenium (Ru), tantalum (Ta), titanium (Ti), tungsten (W), iridium (Ir), rhodium (Rh) and platinum (Pt), etc., or mixtures thereof) to prevent electromigration into the interlayer dielectrics of BEOL interconnect layers 160 in which metal line 150 is formed. In vertical portions 172 of metal line 150, the horizontal extent of metal wires 152 is limited. In contrast, as shown in FIGS. 4 and 5, in the lowermost and uppermost portions 164, 166 of metal line 150, metal wires 152 are horizontally longer to connect vertical portions 172 thereof together.

Metal line 150 may be positioned in any number of back-end-of-line (BEOL) interconnect layers 160 over substrate 112. Metal line 150 may start and end in any BEOL interconnect layer 160. In one example, as shown in FIGS. 1 and 2, metal line 150 may include lowermost horizontal portions 164, e.g., metal wires (also 156, 158), positioned in a first BEOL interconnect layer 162 over substrate 112 with uppermost horizontal portions 166, e.g., metal wires, positioned in (any) second BEOL interconnect layer 170 above first BEOL interconnect layer 162. It is recognized, however, that lowermost horizontal portions 164 of metal line 150 need not be in a lowermost BEOL interconnect layer 162 and can be in a higher than first BEOL interconnect layer 162 or a middle-of-line (MOL) interconnect layer (not shown). As noted, metal wire 150 also includes vertical portions 172, e.g., of various metal wires 152 and vias 154, extending between lowermost horizontal portions 164 and uppermost horizontal portions 166. Although not necessary, metal line 150 may cross boundary 114 at a location of lowermost horizontal portions 166, i.e., of metal wires.

Returning to FIGS. 1 and 2, system 100 may also include a controller 180 for providing defect detection. Controller 180 may be any circuitry and/or software capable of transmitting an electrical signal through metal line 150 and providing the functions described herein. As noted, metal line 150 is arranged in a serpentine path in both vertical and horizontal directions and crossing boundary 114 of cavity 110 and cavity-free area 116 of substrate 112. When a defect 134 (FIG. 1) occurs, it creates a change in metal line 150 such as but not limited to a crack or a break in part thereof, that changes an electrical characteristic of the electrical signal, e.g., voltage, current, frequency, etc. Controller 180, in response to a change in an electrical characteristic of the signal through metal line 150, generates an indication of a presence of defect 134. The indication can take a variety of forms. In one example, the indication can simply be a signal or other communication to part of IC 102 that a potential defect 134 exists, which may require additional investigation or replacement of the IC. In another example, the indication by controller 180 may include changing operation of at least one component of IC 102, i.e., to take corrective action. The corrective action can take a variety of form such as but not limited to: activating backup, duplicative or redundant structure, e.g., another transistor or circuit; optical waveguide or heater; turning off potentially damaged components; and/or redirecting electrical or optical signals to avoid defect 134. In any event, metal line 150 crossing boundary 114 and extending in both vertical and horizontal directions allows for early detection before component failure, regardless of the form of defect 134.

Figure 6:
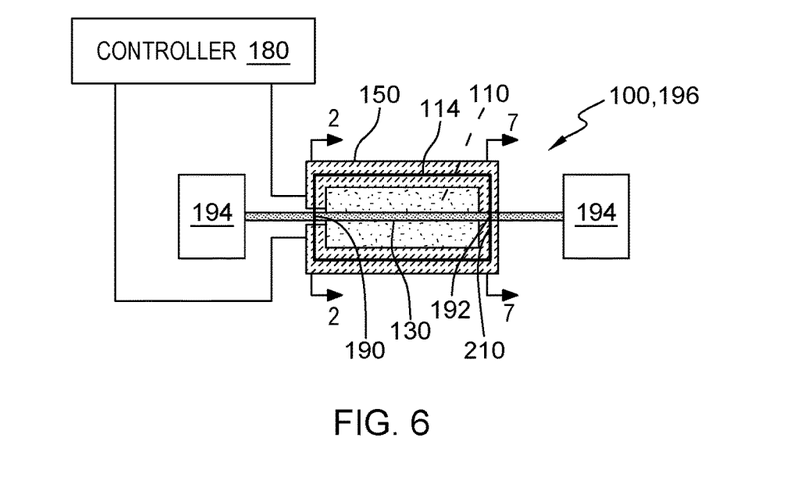
FIG. 6 shows a schematic top-down view of a defect detection system for a photonic integrated circuit, according to embodiments of the disclosure.
Figure 7:
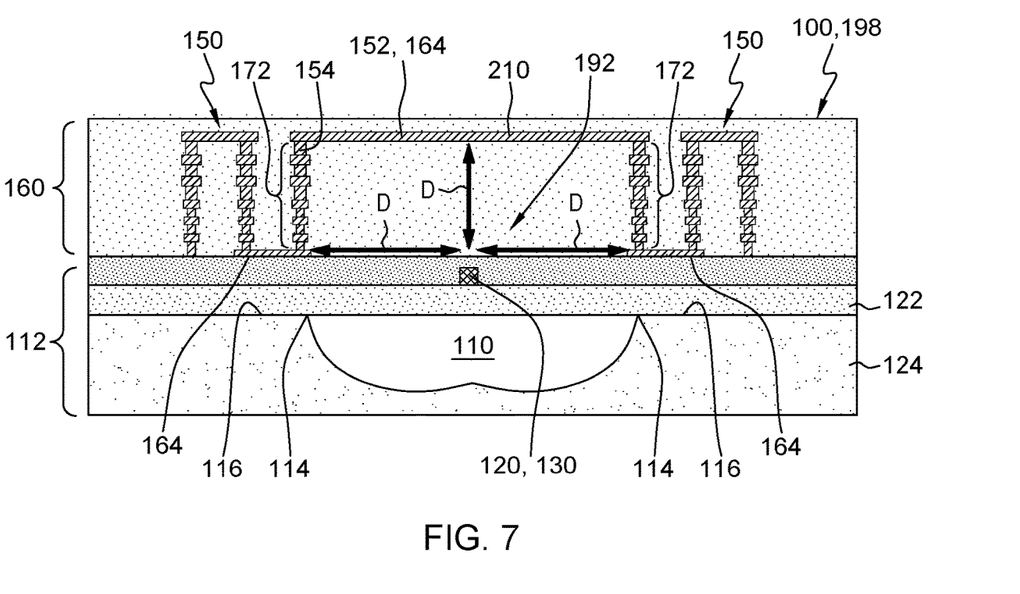
FIG. 7 shows a cross-sectional view of part of the system in FIG. 6, according to embodiments of the disclosure.

FIG. 6 shows a schematic top-down view of system 100 showing optical waveguide 130 extending over cavity 110, i.e., cavity 110 is below optical waveguide 130. As noted, cavity 110 is within boundary 114. As illustrated, optical waveguide 130 extends over a first point 190 of boundary 114 and a second point 192 of boundary 114. In FIG. 6, metal line 150 extends over boundary 114 along most of its length. Optical waveguide 130 may be in optical communication with at least one opto-electric component 194 (two shown) of PIC structure 196, e.g., photodetectors, external input/output devices, etc. FIG. 2 shows the cross-sectional view at first point 190 (see view line 2-2 in FIG. 6), and FIG. 7 shows a cross-sectional view at second point 192 (see view line 7-7 in FIG. 6). In the example shown in FIGS. 2 and 6 (FIG. 1 also), controller 180 may couple to metal line 150 at a first end 200 and a second end 202 thereof. In FIGS. 2, 6 and 7, metal line 150 includes first end 200 and second end 202 over boundary 114 and adjacent to optical waveguide 130 at first point 190, i.e., ends 200, 202 of metal line 150 are at or near first point 190 where optical waveguide 130 crosses boundary 114. As shown in FIGS. 6 and 7, metal line 150 is a continuous loop that extends along an entirety of a length of boundary 114, and includes a bridge portion 210 over optical waveguide 130 at second point 192 of boundary 114. Thus, metal line 150 passes over optical waveguide 130 at second point 192 using bridge portion 210 where optical waveguide 130 crosses boundary 114. That is, in order to pass over optical waveguide 130, as shown in FIG. 7, metal line 150 includes bridge portion 210 over optical waveguide 130 at second point 192 of boundary 114. Bridge portion 210 of metal line 150 may take the form of an extended version of uppermost horizontal portion 164 of metal wires 152 between vertical portions 172. Bridge portion 210 and adjacent vertical portions 172 of metal line 150 may be distanced from optical waveguide 130 sufficiently to prevent any optical or electrical interference. In one non-limiting example, the distance D (see arrows) may be no less than five nanometers (nm).

Figure 8:
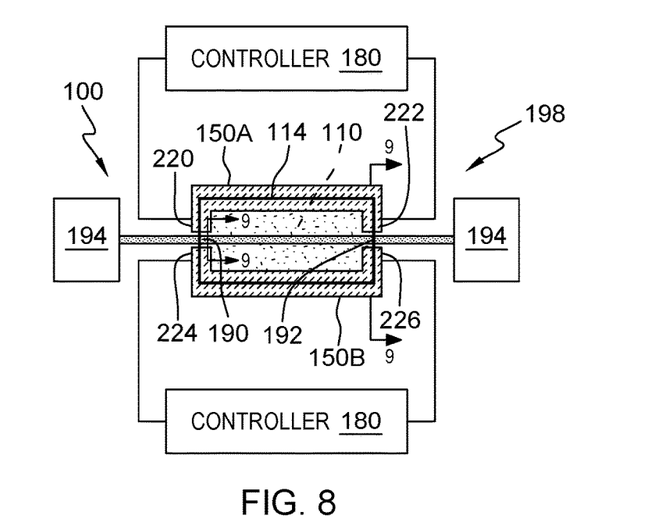
FIG. 8 shows a schematic top-down view of a defect detection system for a photonic integrated circuit, according to other embodiments of the disclosure.
Figure 9:
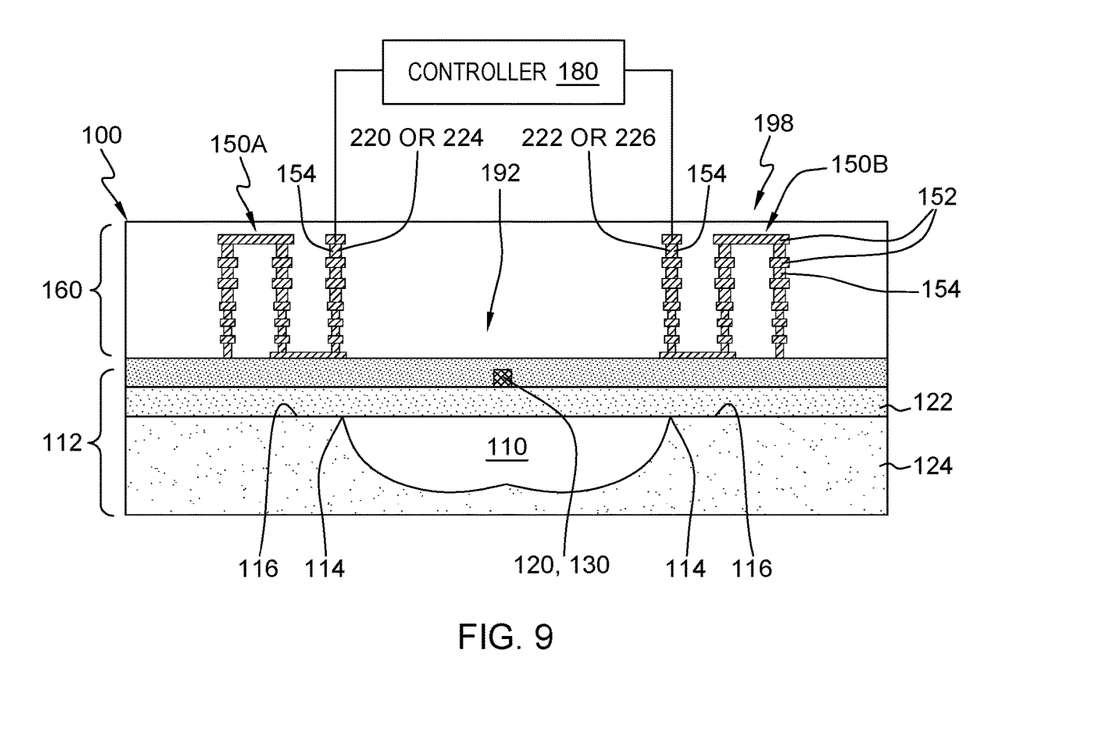
FIG. 9 shows a cross-sectional view of the system in FIG. 8, according to embodiments of the disclosure.

FIG. 8, similar to FIG. 6, shows a schematic top-down view of system 100 showing optical waveguide 130 extending over cavity 110, i.e., cavity 110 is below optical waveguide 130. As noted, optical waveguide 130 extends over first point 190 of boundary 114 and second point 192 of boundary 114. In the FIG. 8 embodiment, metal line 150 is not a continuous loop and does not pass over optical waveguide 130. Rather, metal line 150 is duplicated into a first metal line 150A and a second metal line 150B with each line extending over about half of boundary 114 along its length. As in FIG. 6, optical waveguide 130 may optically couple two or more opto-electric components 194 of PIC structure 196, e.g., photodetectors, external input/output devices, etc. FIG. 9 shows a cross-sectional view at first point 190 (see view line 9-9 in FIG. 8) or at second point 192 (see view line 9-9 in FIG. 8). As shown in FIG. 8, controller 180 may couple to first metal line 150A at a first end 220 and a second end 222 thereof. More particularly, first metal line 150A has first end 220 over boundary 114 and adjacent to optical waveguide 130 at first point 190 of boundary 114, and second end 222 over boundary 114 and adjacent to optical waveguide 130 at second point 192 of boundary 114. Hence, metal line 150A includes first end 220 near first point 190 and second end 222 near second point 192, both ends 220, 222 over boundary 114 and adjacent to optical waveguide 130 at the respective points. Similarly, another or the same controller 180 may couple to second metal line 150B at a first end 224 and a second end 226 thereof. Second metal line 150B has first end 224 over boundary 114 and adjacent to optical waveguide 130 at first point 190 of boundary 114 and second end 226 over boundary 114 and adjacent to optical waveguide 130 at second point 192 of boundary 114. Hence, second metal line 150B includes first end 224 near first point 190 and second end 226 near second point 192, both ends 224, 226 over boundary 114 and adjacent to optical waveguide 130 at the respective points. Each metal line 150A, 150B extends along about half of a length of boundary 114. While two controllers 180 are shown for clarity, only one controller 180 may be used. Vertical portions 172 at the various ends 220, 222, 224, 226 of metal lines 150A-B may be distanced from optical waveguide 130 sufficiently to prevent any optical or electrical interference.

While two metal lines 150A, 150B are shown in FIGS. 8 and 9, any number of metal lines may be used about a single cavity 110. For example, a cavity 110 having a complicated shape that may have better defect detection with more than two metal lines over different areas of a boundary thereof.

Figure 10:
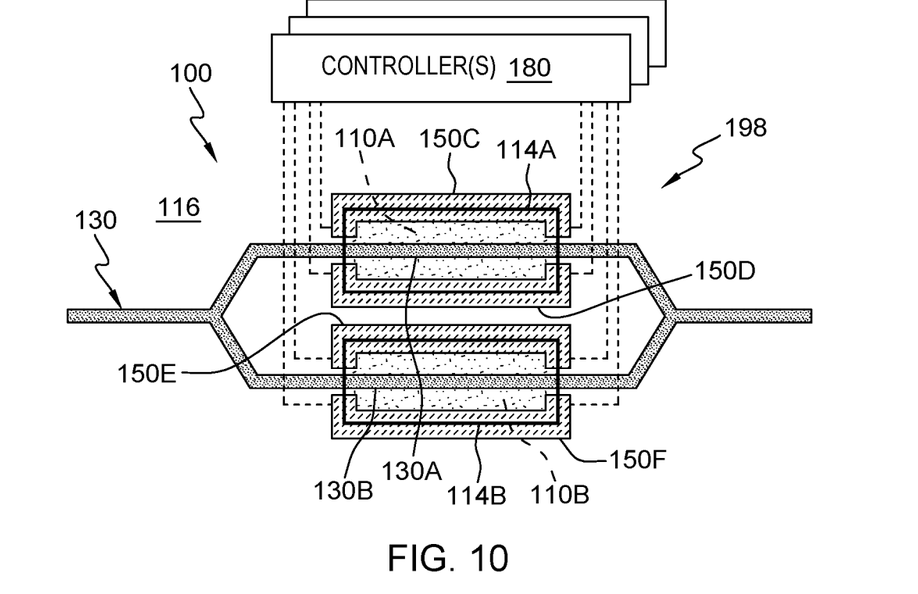
FIG. 10 shows a schematic top-down view of a defect detection system for a photonic integrated circuit, according to additional embodiments of the disclosure.
Figure 11:
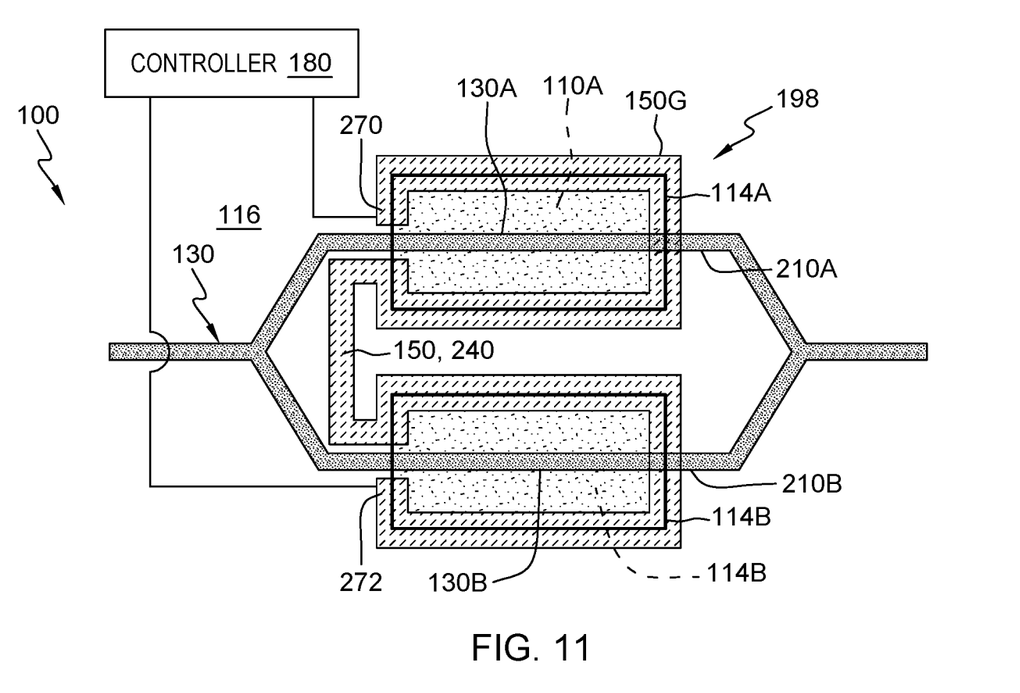
FIG. 11 shows a schematic top-down view of a defect detection system for a photonic integrated circuit, according to yet other embodiments of the disclosure.

Referring to FIGS. 10 and 11, in other embodiments, system 100 (in an IC or PIC) may include more than one cavity 110A, 110B defined in the substrate. A respective boundary 114A, 114B is located where each cavity 110A-B meets with cavity-free area 116 of the substrate. While two cavities 110A-B are shown, it will be recognized that ICs and PICs may include many more cavities, e.g., as in a neural network. As shown in FIG. 10, system 100 may include metal lines 150C-F similar to that shown and described relative to FIGS. 8-9. That is, system 100 may detect defects in a segmented fashion with a different metal line 150C-F on each side of optical waveguide segments 130A-B and one or more controller(s) 180 for metal lines 150C-F. Alternatively, as shown in FIG. 11, system 100 may include a single, continuous loop, metal line 150G (similar to that shown and described relative to FIGS. 6-7) extending along an entirety of a length of boundaries 114A-B of cavities 110A-B with one or more bridge portions 210A, 210B. Metal line 150G may also include any necessary connector portions 240 connecting would-be ends of metal line 150G to make it continuous. In any event, metal line(s) 150C-F or 150G is arranged in the serpentine path in both the vertical and the horizontal direction and crosses boundaries 114A-B of each cavity 110A-B as much as possible to provide early detection of defects.

Embodiments of the disclosure also include PIC 198. PIC 198 includes optical waveguide 130 over substrate 112. As shown in FIGS. 6 and 8, optical waveguide 130 may be in optical communication with at least one opto-electrical component 194. PIC 198 also includes one or more cavities 110 defined in substrate 112 under optical waveguide 130. Boundary 114 is located where each cavity 110 meets a cavity-free area 116 of substrate 112, e.g., with an upper surface of base semiconductor layer 124. Optical waveguide 130, cavity(ies) 110 and boundaries 114 can take any form previously described herein. PIC 198 includes defect detection system 100, as described herein. That is, PIC 198 includes metal line(s) 150 arranged in a serpentine path in vertical and a horizontal directions, and crossing boundary (ies) 114. Controller(s) 180 is configured to, in response to a change in an electrical characteristic of a signal through metal line(s) 150, generate an indication of the presence of a defect and/or change operation of at least one component of PIC 198, as described herein.

While the certain embodiments of the disclosure, such as the multiple cavity embodiments shown in FIGS. 10-11 are described herein relative to a PIC 198 including optical waveguide 130, the teachings of any of the embodiments are applicable to any IC 102 without photonics therein.

Figure 12:
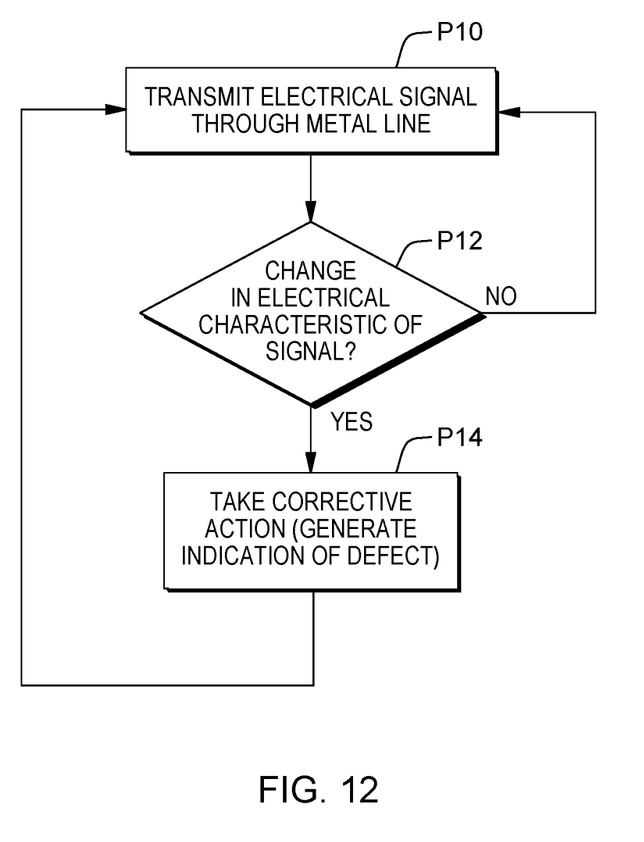
FIG. 12 shows a flow diagram of a method, according to embodiments of the disclosure.

A method of detecting defect 134 (FIG. 1) in IC 102 or PIC 198 will now be described. FIG. 12 shows a flow diagram illustrating operation of system 100. In operation, in process P10, controller(s) 180 transmits an electrical signal through metal line(s) 150 arranged in a serpentine path in both a vertical and a horizontal direction and crossing one or more boundaries 114 of one or more cavities 110. Each cavity 110 is defined in substrate 112. Boundaries 114 are between a respective cavity 110 and cavity-free area 116 of substrate 112, i.e., along an edge of the respective cavity 110. In process P12, controller(s) 180 determines whether a change in electrical characteristic of the signal(s) exists. The electrical characteristic can be anything about the electrical signal, e.g., voltage, current, frequency, etc., that is measurable by controller(s) 180. When no change is detected, i.e., No at process P12, transmitting and monitoring in process P10 and P12 continues. In response to a change in an electrical characteristic of the signal(s) through metal line(s) 150, i.e., Yes at process P12, in process P14, controller(s) 180 changes operation of at least one component of IC 102 or PIC 198. In addition, or alternatively thereto, controller(s) 180 may generate an indication of a presence of the defect, as described herein. Where more than one metal line 150 is provided, controller(s) 180 may react in response to a change in an electrical characteristic of the electric signal through at least one of the metal lines, e.g., at least one first metal line 150A and second metal line 150B in FIG. 8, or any of metal lines 150C-F in FIG. 10. Where a change in the IC or PIC is implemented, the change can implement any desired corrective action. As previously noted, the corrective action can take a variety of forms such as but not limited to: activating backup, duplicative or redundant structure, e.g., another optical waveguide or heater; turning off potentially damaged components; and/or redirecting electrical or optical signals to avoid defect 134. In any event, metal line 150 crossing boundary 114 and extending in both vertical and horizontal directions allows for early detection before component failure, regardless of the form of defect 134.

Embodiments of the disclosure provide various technical and commercial advantages, examples of which are discussed herein. The structure provides early detection of defects, such as cracks, prior to failure of component, and allows an indication of the defect and/or corrective action. Despite the exact location of the boundary being difficult to control during fabrication (e.g., because of under or over etching during formation of the cavities), the serpentine metal line always crosses the boundary. Hence, defect detection can be ensured and a larger fabrication tolerance for the cavities is provided.

The structure and method as described above are used in the fabrication of integrated circuit or photonic integrated circuit chips. The resulting chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A defect detection system for an integrated circuit (IC), comprising:
    a metal line arranged in a serpentine path in both a vertical and a horizontal direction and crossing a boundary of a cavity and a cavity-free area of a substrate,
    wherein the cavity is below an optical waveguide, and the optical waveguide extends over a first point of the boundary and a second point of the boundary, and
    wherein the metal line includes a first end and a second end over the boundary and adjacent to the optical waveguide at the first point, and the metal line extends along an entirety of a length of the boundary and includes a bridge portion over the optical waveguide at the second point of the boundary; and
    a controller configured to, in response to a change in an electrical characteristic of a signal through the metal line, generate an indication of a presence of a defect.

2. The defect detection system of claim 1, wherein the controller is further configured to, in response to a change in an electrical characteristic of a signal through the metal line, change operation of at least one component of the IC.

3. The defect detection system of claim 1, wherein the metal line includes lowermost horizontal portions positioned in a first back-end-of-line (BEOL) interconnect layer over the substrate; uppermost horizontal portions positioned in a second BEOL interconnect layer above the first BEOL interconnect layer; and vertical portions extending between the lowermost horizontal portions and the uppermost horizontal portions.

4. The defect detection system of claim 3, wherein the metal line crosses the boundary at a location of the lowermost horizontal portions.

5. The defect detection system of claim 1, wherein the cavity defined in the substrate includes more than one cavity, wherein a respective boundary is located where each cavity meets with a cavity-free area of the substrate and wherein the metal line is arranged in the serpentine path in both the vertical and the horizontal direction and crosses the boundary of each cavity.

6. A method of detecting a defect in an integrated circuit (IC), comprising:
  transmitting an electrical signal through a metal line arranged in a serpentine path in both a vertical and a horizontal direction and crossing a boundary of a cavity and a cavity-free area of a substrate, the cavity defined in the substrate,
  wherein the cavity is below an optical waveguide and the optical waveguide extends over a first point of the boundary and a second point of the boundary, and
  wherein the metal line includes a first end and a second end over the boundary and adjacent to the optical waveguide at the first point, and the metal line extends along an entirety of a length of the boundary and includes a bridge portion over the optical waveguide at the second point of the boundary; and
  in response to a change in an electrical characteristic of the signal through the metal line, changing operation of at least one component of the IC.

7. The method of claim 6, further comprising, in response to the change in the electrical characteristic of the signal through the metal line, generating an indication of a presence of the defect.

8. The method of claim 6, wherein the metal line includes lowermost horizontal portions positioned in a first back-end-of-line (BEOL) interconnect layer over the substrate; uppermost horizontal portions positioned in a second BEOL interconnect layer above the first BEOL interconnect layer; and vertical portions extending between the lowermost horizontal portions and the uppermost horizontal portions.

9. The method of claim 8, wherein the metal line crosses the boundary at a location of the lowermost horizontal portions.

10. The method of claim 6, wherein the cavity defined in the substrate includes more than one cavity, wherein a respective boundary is located where each cavity meets with a cavity-free area of the substrate and wherein the metal line is arranged in the serpentine path in both the vertical and the horizontal direction and crosses the boundary of each cavity.

11. The method of claim 6, wherein the integrated circuit is a photonics integrated circuit (PIC), and the optical waveguide is in optical communication with at least one opto-electrical component.

12. A defect detection system for an integrated circuit (IC), comprising:
  a substrate including a cavity and a cavity-free area, wherein the cavity is below an optical waveguide, and wherein the optical waveguide extends over a first point of a boundary between the cavity and the cavity-free area, and a second point of the boundary;
  a metal line traversing a serpentine path in a vertical direction and a horizontal direction within the substrate, and crossing a boundary of the cavity and the cavity-free area of the substrate, the metal line including:
    a first segment having a first end over the boundary and adjacent to the optical waveguide at the first point of the boundary, and a second end over the boundary and adjacent to the optical waveguide at the second point of the boundary; and
    a second segment having a first end over the boundary and adjacent to the optical waveguide at the first point of the boundary and a second end over the boundary and adjacent to the optical waveguide at the second point of the boundary,
    wherein the first segment and the second segment each extend along at least half of a length of the boundary; and
  a controller configured to, in response to a change in an electrical characteristic of a signal through the metal line, generate an indication of a presence of a defect.

13. The defect detection system of claim 12, wherein the controller is further configured to, in response to a change in an electrical characteristic of a signal through the metal line, change operation of at least one component of the IC.

14. The defect detection system of claim 12, wherein the metal line includes lowermost horizontal portions positioned in a first back-end-of-line (BEOL) interconnect layer over the substrate; uppermost horizontal portions positioned in a second BEOL interconnect layer above the first BEOL interconnect layer; and vertical portions extending between the lowermost horizontal portions and the uppermost horizontal portions.

15. The defect detection system of claim 14, wherein the metal line crosses the boundary at a location of the lowermost horizontal portions.

16. The defect detection system of claim 12, wherein the cavity defined in the substrate includes more than one cavity, wherein a respective boundary is located where each cavity meets with a cavity-free area of the substrate and wherein the metal line is arranged in the serpentine path in both the vertical and the horizontal direction and crosses the boundary of each cavity.

17. The defect detection system of claim 12, wherein the integrated circuit is a photonics integrated circuit (PIC), and wherein the optical waveguide is in optical communication with at least one opto-electrical component.

18. The defect detection system of claim 1, wherein the integrated circuit is a photonics integrated circuit (PIC), and wherein the optical waveguide is in optical communication with at least one opto-electrical component.

* * * * *